United States Patent
Liu et al.

(10) Patent No.: US 10,115,585 B2
(45) Date of Patent: Oct. 30, 2018

(54) HARDMASK COMPOSITION AND METHODS THEREOF

(71) Applicant: Taiwan Semiconductor Manufacturing Co., Ltd., Hsinchu (TW)

(72) Inventors: Chen-Yu Liu, Kaohsiung (TW); Ching-Yu Chang, Yilang County (TW); Chin-Hsiang Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/628,261

(22) Filed: Jun. 20, 2017

(65) Prior Publication Data

US 2018/0174831 A1 Jun. 21, 2018

Related U.S. Application Data

(60) Provisional application No. 62/434,933, filed on Dec. 15, 2016.

(51) Int. Cl.
| | |
|---|---|
| *C08G 77/16* | (2006.01) |
| *H01L 21/02* | (2006.01) |
| *H01L 21/308* | (2006.01) |
| *H01L 21/033* | (2006.01) |
| *C08G 77/52* | (2006.01) |
| *C08G 77/00* | (2006.01) |

(52) U.S. Cl.
CPC ........ *H01L 21/02216* (2013.01); *C08G 77/16* (2013.01); *C08G 77/52* (2013.01); *C08G 77/70* (2013.01); *H01L 21/02126* (2013.01); *H01L 21/0332* (2013.01); *H01L 21/3081* (2013.01)

(58) Field of Classification Search
CPC ......... C08G 77/16; C08G 77/52; C08G 77/70
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |

(Continued)

*Primary Examiner* — Errol Fernandes
(74) *Attorney, Agent, or Firm* — Haynes and Boone, LLP

(57) ABSTRACT

Provided is a material composition and method for that includes forming a silicon-based resin over a substrate. In various embodiments, the silicon-based resin includes a nitrobenzyl functional group. In some embodiments, a baking process is performed to cross-link the silicon-based resin. Thereafter, the cross-linked silicon-based resin is patterned and an underlying layer is etched using the patterned cross-linked silicon-based resin as an etch mask. In various examples, the cross-linked silicon-based resin is exposed to a radiation source, thereby de-cross-linking the silicon-based resin. In some embodiments, the de-cross-linked silicon-based resin is removed using an organic solution.

20 Claims, 7 Drawing Sheets

(56) References Cited

U.S. PATENT DOCUMENTS

| | | | |
|---|---|---|---|
| 9,543,147 B2 * | 1/2017 | Liu | H01L 21/0276 |
| 9,548,303 B2 | 1/2017 | Lee et al. | |
| 2004/0023498 A1 * | 2/2004 | Harchanko | B81C 1/00626 |
| | | | 438/694 |

* cited by examiner

HARDMASK COMPOSITION AND METHODS THEREOF

CROSS-REFERENCE TO RELATED APPLICATIONS

This application claims the benefit of U.S. Provisional Application No. 62/434,933, filed Dec. 15, 2016, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, a typical lithography process may include forming a patterned resist layer over a hard mask layer. An etching process may subsequently follow, where the hard mask layer is etched using the patterned resist layer as an etch mask, thereby transferring the pattern to the hard mask layer. Further steps are performed to transfer the pattern to a substrate. As IC dimensions continue to scale down, resist layers have also scaled down, presenting new challenges. In some examples, the resist pattern has become narrower and taller, where such high aspect ratios cause the resist pattern to easily collapse. Additionally, as resist layer thicknesses have decreased, there may not be a sufficient thickness of resist to adequately transfer a resist pattern to an underlying layer. In some aspects, this may be due to an insufficient etching resistance of the resist layer. Various bilayer and multilayer (e.g., tri-layer) resist structures have been used in an effort to implement thin imaging layers which overcome one or more of the problems noted above. However, in at least some cases, removal of one or more layers of such a bilayer or multilayer resist structure may also etch an underlying layer, thereby damaging the underlying layer.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
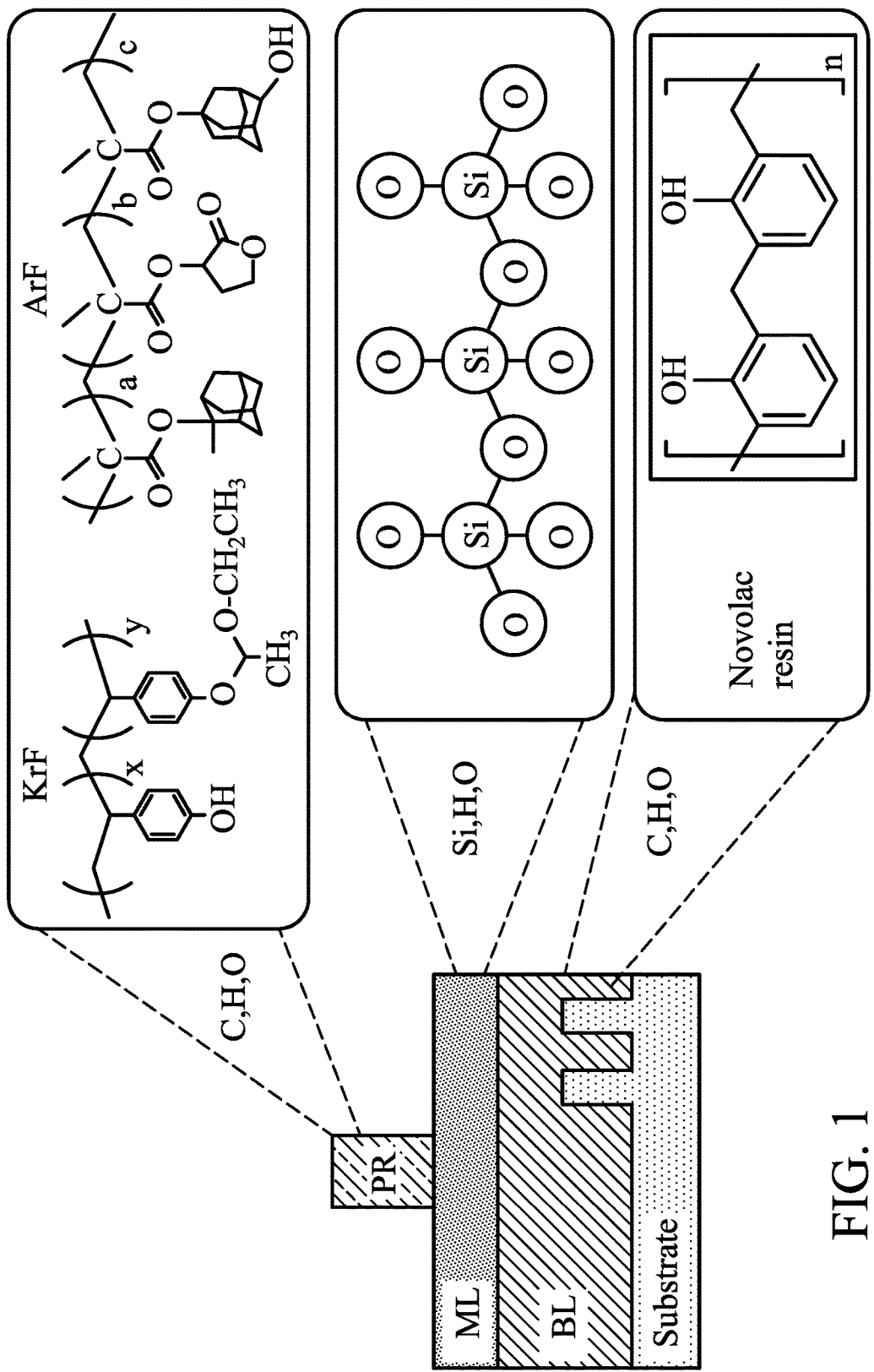
FIG. 1 is a cross-sectional view multi-layer resist structure, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments that may be employed to for the fabrication of planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

The present disclosure is generally related to methods for semiconductor device fabrication, and more particularly to material compositions and/or complexes as part of a lithography process. In a typical lithography patterning process, a resist layer is formed over a hard mask layer and is patterned with an IC design layout. An etching process is subsequently followed, which etches the hard mask layer using the patterned resist layer as an etch mask, thereby transferring the pattern to the hard mask layer. Further steps are performed to transfer the pattern to a substrate. As IC dimensions continue to scale down, resist layers have also scaled down, presenting new challenges. In some examples, the resist pattern has become narrower and taller, where such high aspect ratios cause the resist pattern to easily collapse. Additionally, as resist layer thicknesses have decreased, there may not be a sufficient thickness of resist to adequately transfer a resist pattern to an underlying layer. In some aspects, this may be due to an insufficient etching resistance of the resist layer.

Silicon-containing materials, implemented in bilayer and multilayer (e.g., tri-layer) processes, have been used in an effort to successfully implement thin imaging layers which overcome one or more of the problems noted above (e.g., pattern collapse, insufficient etching resistance, etc.). In the bilayer approach, a silicon-containing resist layer may be formed over a BARC layer. The silicon-containing resist has a higher etch resistance than conventional resists and therefore needs not be as thick as conventional resists. In the multilayer or tri-layer approach, a thin resist layer may be formed over a silicon-containing BARC (or hard mask) layer which is in turn formed over an underlying BARC layer. In some embodiments, the silicon-containing BARC layer may be formed over an organic underlayer such as a spin-on carbon underlayer. The thin resist layer may be used to pattern the silicon-containing BARC layer, which is then used to pattern the underlying BARC layer. In various embodiments, all three layers (i.e., resist, silicon-containing BARC, and underlying BARC) may be formed using a spin-coating process or a chemical vapor deposition (CVD) process.

Both the bilayer and multilayer approach take advantage of the high density of the silicon-containing materials used therein, which is a result of a cross-linking capability of their constituent monomers and molecules. With reference to the example of FIG. 1, a tri-layer structure is illustrated, where examples of materials used for each layer of the tri-layer structure are shown. For example, in some cases, the resist layer 'PR' may include a material containing one or more of carbon (C), hydrogen (H), and oxygen (O). As shown in FIG. 1, different resist materials may be used for processes employing a KrF laser as the radiation source (248 nm) or an ArF laser as the radiation source (193 nm). While some examples of resist materials and radiation sources have been given, other types of resist materials and radiation sources and radiation wavelengths may be used (e.g., EUV, e-beam) without departing from the scope of the present disclosure. In some examples, the silicon-containing layer may be equivalently referred to as a middle layer 'ML', where the ML includes a material containing one or more of silicon (Si), H, and O. In some cases, and in more detail, the ML may include Si bonded to $OR_1$ groups, where O is oxygen and $R_1$ includes an organic substituent such as methyl, ethyl, or aryl. Monomers of the silicon-containing material may be very unstable and constituent $OR_1$ groups may readily hydrolyze, resulting in monomers where a hydroxyl group is formed in place of an $OR_1$ group. In some cases, such silicon-containing monomers may react to form a cross-linked structure. In various examples, the hydrolysis and cross-linking described above will readily occur when solvents of the silicon-containing materials dry out (e.g., due to a baking process). In some cases, the ML may include a spin-on glass (SOG) layer. In some examples, the underlying BARC layer may be equivalently referred to as a 'BL', where the BL includes a material containing one or more of C, H, and O. In some examples, the BL may include a Novolac resin. In some embodiments, the BL may include a spin-on carbon (SOC) layer.

Figures 2A, 2B, 2C:
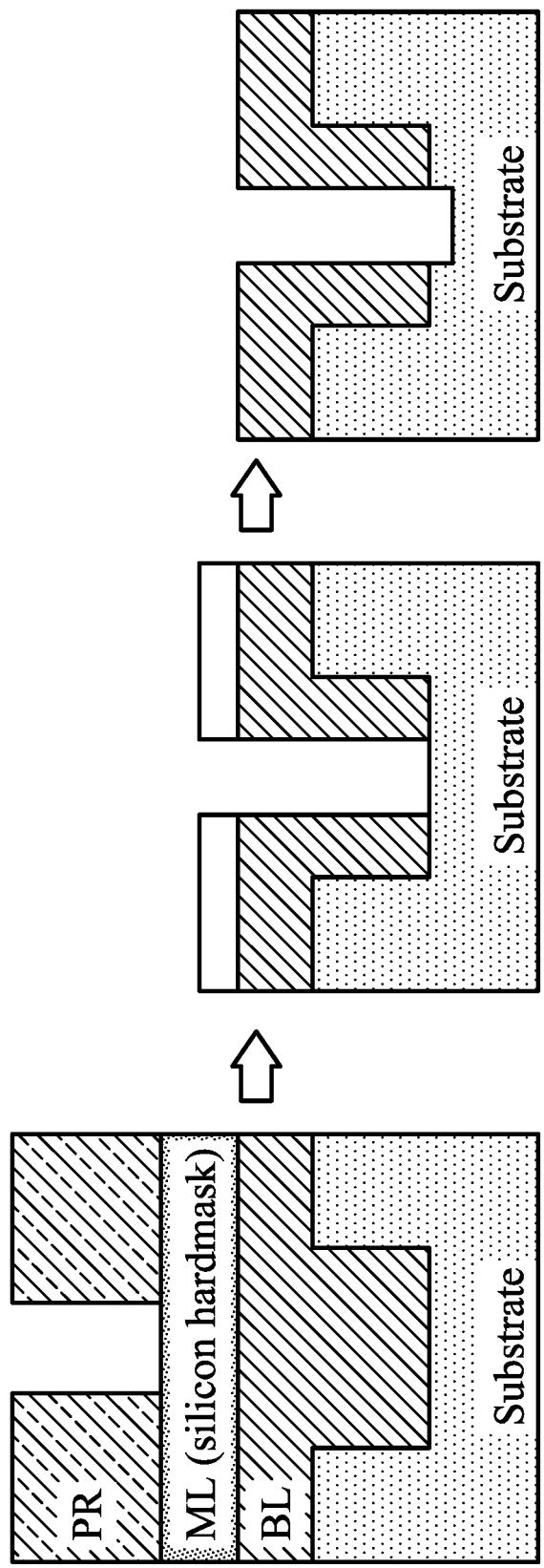
FIGS. 2A, 2B, and 2C show cross-sectional views of a multi-layer resist structure, including patterning thereof, according to some embodiments.

At least one of the challenges of the tri-layer structure and materials discussed above with reference to FIG. 1 is the difficulty in controlling an etch selectivity between adjacent layers (e.g., PR-to-ML and ML-to-BL). In particular, with reference to FIGS. 2A, 2B, and 2C, a tri-layer structure (e.g., similar to that of FIG. 1) is shown, and a key challenge of how to remove the ML without damaging an underlying substrate is illustrated. For instance, in this example, the substrate may include a low-K film (e.g., such as an oxide layer) that is very sensitive to acids and bases (e.g., wet etch processes) as well as to etch plasma (e.g., dry etch processes). By way of example, the PR may first be patterned (FIG. 2A), and the PR pattern may be subsequently transferred to each of the ML and BL in turn, for example, via a wet and/or dry etch process (FIG. 2B). Thereafter, the ML may be removed by a wet and/or dry etching process (FIG. 2C). However, in at least some cases, removal of the ML may also etch the underlying substrate (e.g., the low-K film), thereby damaging the underlying substrate. Stated another way, it is very difficult to effectively remove the ML without damaging the underlying substrate. While the present example is described as having a low-K film as the underlying substrate, similar substrate damage may occur with other types of underlying substrate materials.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, an alternative ML material composition and related method are provided. In various embodiments, the alternative ML material composition and related method provide for de-cross-linking a previously cross-linked ML, such that the de-cross-linked ML may be readily removed (e.g., by a solvent) without damaging an underlying substrate layer.

Figure 4:
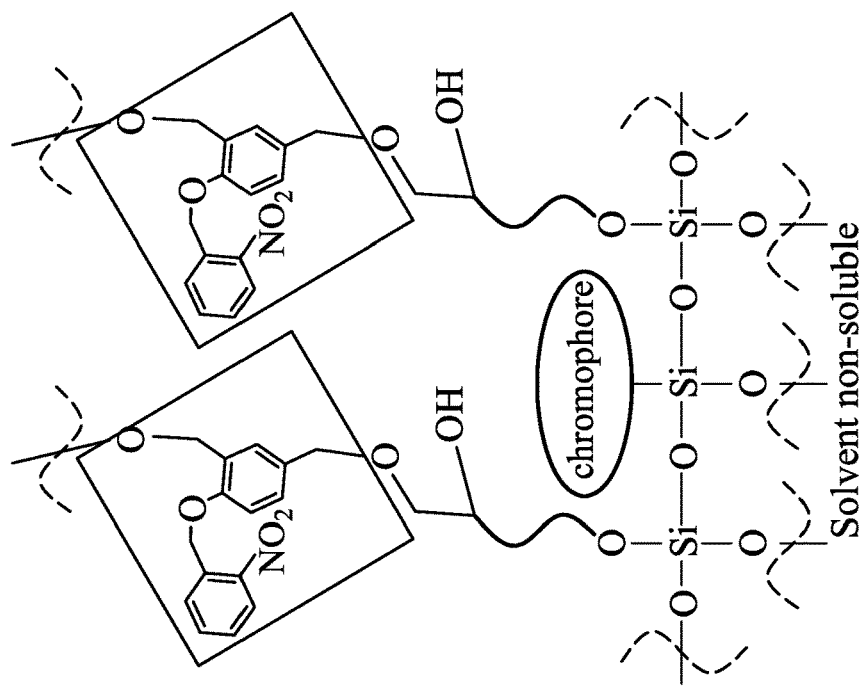
FIGS. 3 and 4 show examples of a material composition, before and after a baking step, in accordance with some embodiments.
Figure 3:
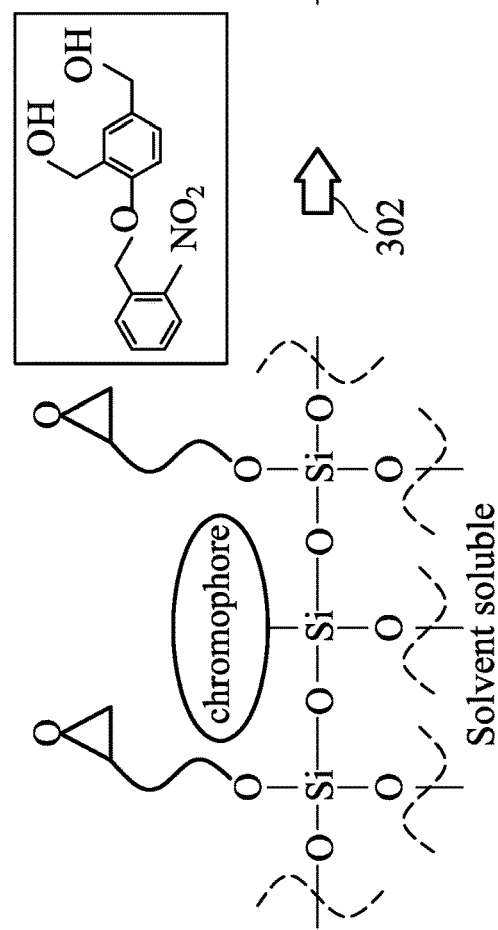
Figures 5, 6:
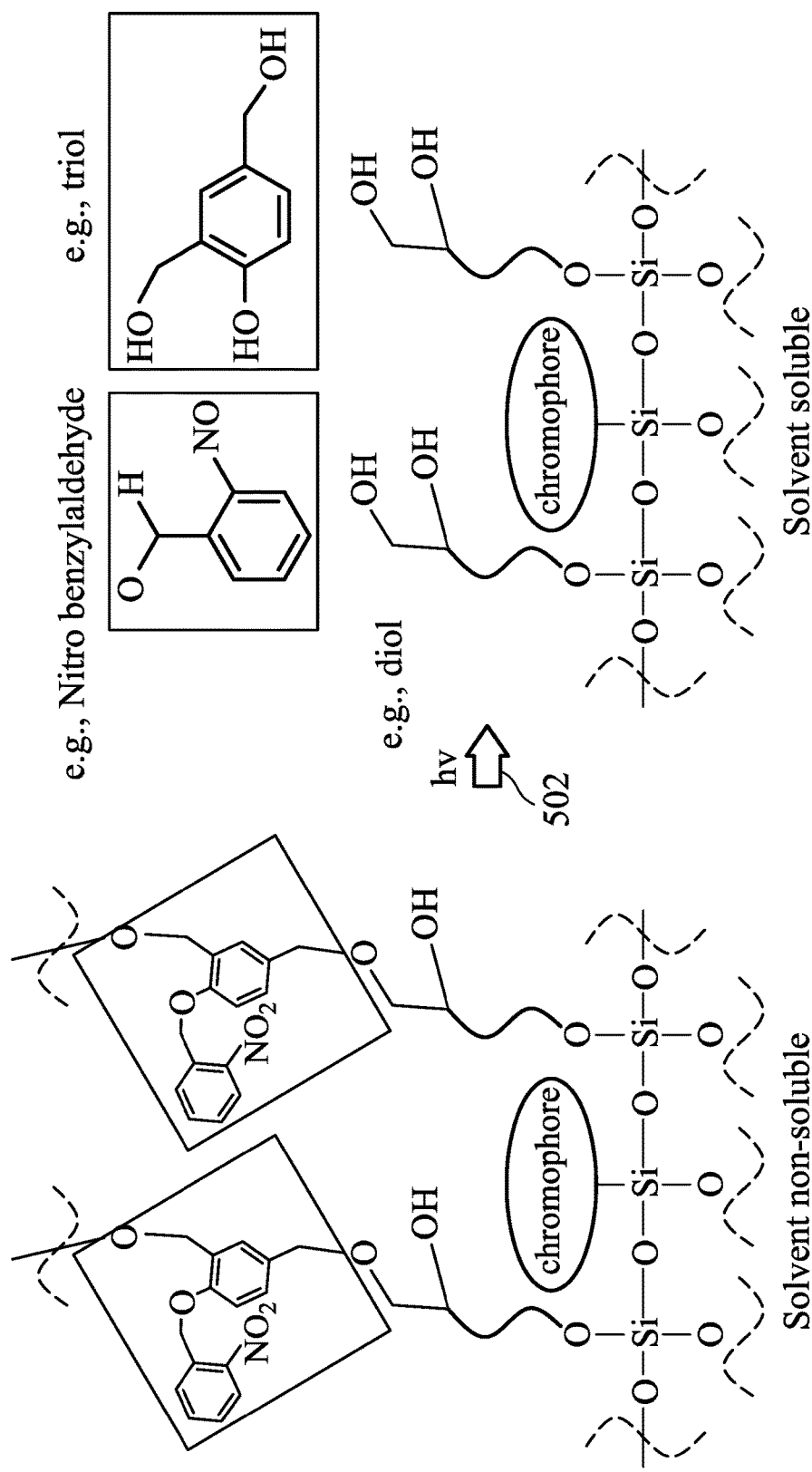
FIGS. 5 and 6 show examples of the material composition, before and after exposure to a radiation source, in accordance with some embodiments.

With reference to the example of FIGS. 3 and 4, in some embodiments, the alternative ML material composition disclosed herein may include a silicon-based resin having a nitrobenzyl functional group that serves as a cross-linking functional group. In some embodiments, the silicon-based resin includes a siloxane backbone. In various examples, the nitrobenzyl functional group may include an alkyl chain or aromatic ring with C4-C20, hydrogen, a hydroxyl group, an alkoxyl group, an amine, a nitro group, a cyano group, a nitrosyl group, an isocyano group, and/or a thiol group. In some embodiments, the silicon-based resin has a molecular weight (MW) equal to about 1,000 to about 20,000. In some cases, the alternative ML material composition also includes a chromophore. In some embodiments, the alternative ML material composition is initially solvent soluble (FIG. 3) and becomes solvent non-soluble (FIG. 4) after a baking step 302. Stated another way, the alternative ML composition material becomes cross-linked upon baking. With reference to the example of FIGS. 5 and 6, in some embodiments, the alternative ML material composition, which is initially cross-linked and solvent non-soluble (FIG. 4 and FIG. 5), may be de-cross-linked (FIG. 6) upon UV irradiation 502. For example, upon exposure by a light source having a wavelength of about 150 nm-300 nm, the alternative ML material composition may become de-cross-linked. As a result of the de-cross-linking, the alternative ML material composition may once again become solvent soluble. In some embodiments, the de-cross-linked alternative ML material composition may be removed by an organic solvent, while leaving any underlying substrate material undamaged.

It is noted that the material compositions, metal complexes, and methods of the present disclosure are not limited to a particular substrate type, mask type, resist type, radiation source (e.g., radiation wavelength), and/or lithography system type. For example, the material compositions, metal complexes, and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly(methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Figure 7:
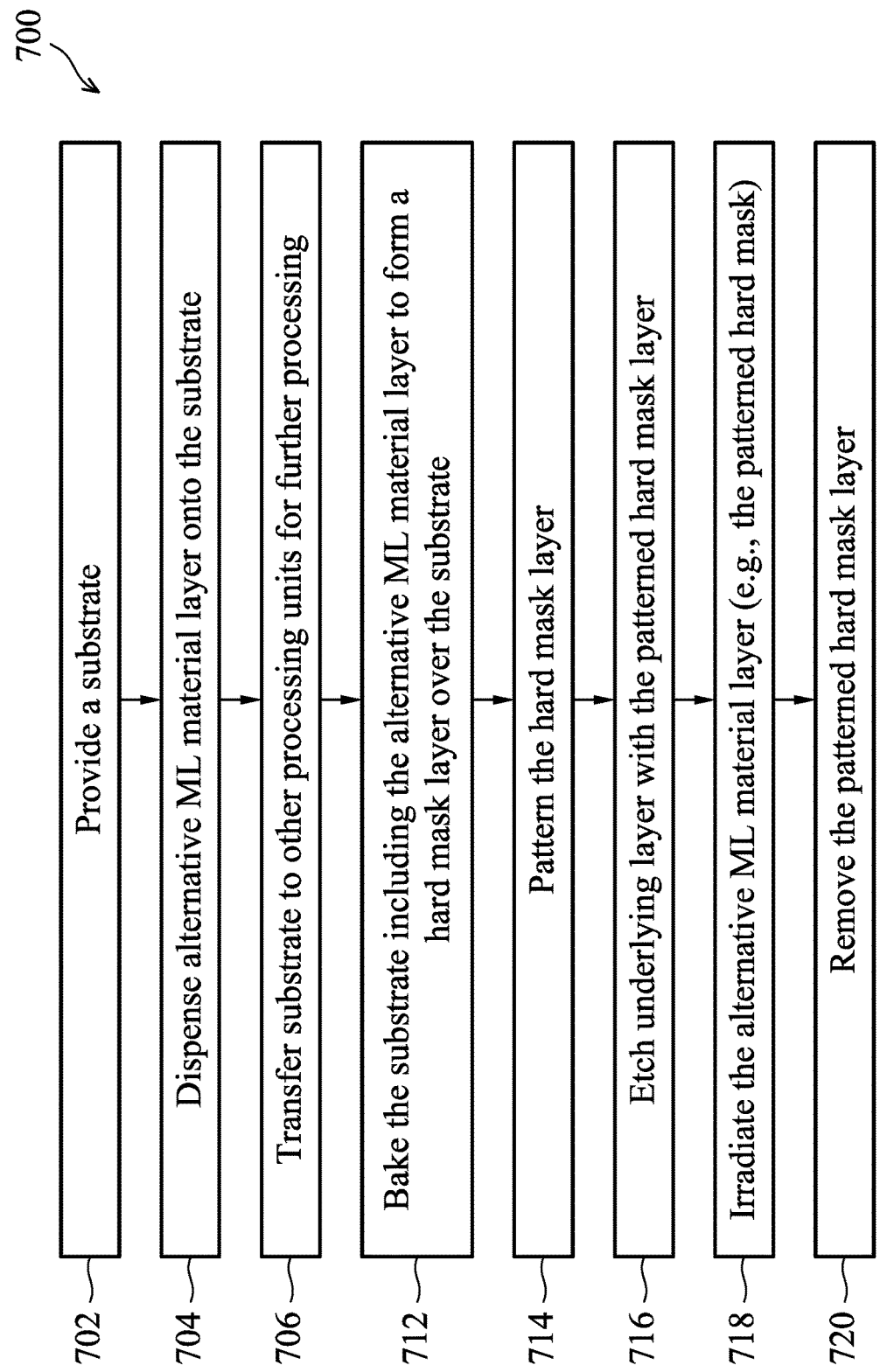
FIG. 7 illustrates a flow chart of a semiconductor manufacturing method, according to various embodiments.

With reference now to FIG. 7, illustrated therein is a flow chart of a semiconductor manufacturing method 700, illustrating some exemplary applications of various embodiments of the alternative ML material composition. Additional steps may also be provided before, during, and after the method 700, and some steps described can be replaced, eliminated, or moved before or after other steps for additional embodiments of the method. It is also noted that the method 700 is exemplary, and is not intended to limit the present disclosure beyond what is explicitly recited in the claims that follow. The method 700 will be further described below in conjunction with FIGS. 8A, 8B, 8C, 8D, 8E, 8F, 8G, and 8H.

Figure 8B:
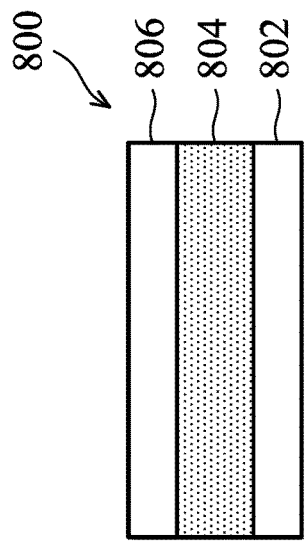
FIGS. 8A, 8B, 8C, 8D, 8E, 8F, 8G, and 8H provide cross-sectional views of a device at intermediate stages of fabrication and processed in accordance with the method of FIG. 7.
Figure 8D:
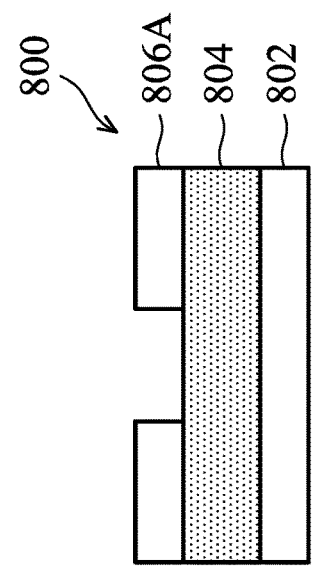
Figure 8A:
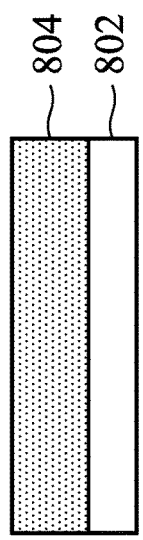

Referring to FIGS. 7 and 8A, the method 700 begins at block 702 where a substrate 802, used to fabricate a semiconductor device 800, is provided. In various embodiments, the substrate 802 is a semiconductor wafer, such as a silicon wafer. Additionally, in some embodiments, the substrate 802 may include various layers, including conductive or insulating layers formed on a semiconductor substrate. The substrate 802 may further include various doping configurations depending on design requirements as is known in the art. The substrate 802 may also include other semiconductors such as germanium, silicon carbide (SiC), silicon germanium (SiGe), or diamond. Alternatively, the substrate 802 may include a compound semiconductor and/or an alloy semiconductor. Further, the substrate 802 may optionally include an epitaxial layer (epi-layer), may be strained for performance enhancement, may include a silicon-on-insulator (SOI) structure, and/or have other suitable enhancement features. Also shown in FIG. 8A, the device 800 further includes a BARC layer 804 formed over the substrate 802 as the bottom layer of a tri-layer lithographic stack. In an embodiment, the BARC layer 804 is formed using a spin-coating process, followed by a baking process.

Referring to FIGS. 7 and 8B, the method 700 proceeds to block 704 where an alternative ML material is formed over the BARC layer 804 to form an alternative ML material layer 806. In an embodiment, the alternative ML material layer 806 is formed using a spin-coating process. By way of example, a thickness of the alternative ML material layer 806 may be controlled by a spin speed, dispensing flow rate, dispensing time, and other factors, of the spin-coating process. The method 700 proceeds to block 706 where after the alternative ML material layer 806 has been formed over the BARC layer 804, the device 800 is moved to other processing units for further processes.

In some embodiments, after the alternative ML material layer 806 has been spin-coated over the BARC layer 804 and the device 800 has been moved for further processing, the method 700 proceeds to block 712 where the substrate 802 including the BARC layer 804 and the alternative ML material layer 806 is baked. In some embodiments, the baking operation may take place in another processing unit, such as an oven or furnace, separate from the spin-coating system. In various embodiments, the baking operation drives solvent out of the alternative ML material layer 806 and solidifies the material therein, making it a hard mask layer 806 (FIG. 8B) for subsequent etching processes. In some embodiments, drying out of the solvent, for example by the baking process, serves to initiate the cross-linking process described above. Thus, after the baking process of block 712, the alternative ML material layer 806 becomes solvent non-soluble.

Figure 8C:
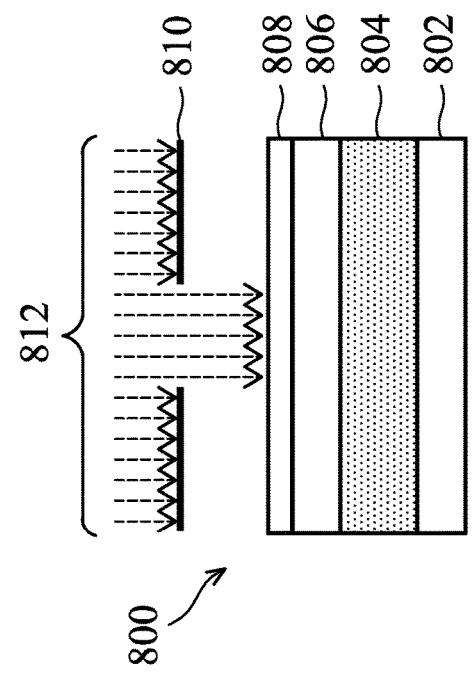

The method 700 proceeds to block 714 where the baked alternative ML material layer 806 (i.e., the hard mask layer 806) is patterned. In some examples, patterning the hard mask layer 806 includes multiple steps, as illustrated in FIGS. 8C and 8D. Referring to FIG. 8C, in an embodiment of block 714, a resist layer 808 is formed over the hard mask layer 806, the resist layer 808 is exposed to radiation 812 through a mask (or photo-mask or reticle) 810, and the exposed resist layer 808 is developed to form a patterned resist layer. In various embodiments, the resist layer 808 may be a positive resist or a negative resist. A positive resist is normally insoluble in a resist developer, but is made soluble by exposure to the radiation. A negative resist has the opposite behavior. By way of example, the mask 810 may include an IC design layout pattern to be formed on the device 800. The radiation 812 may include deep ultraviolet (DUV) radiation, extreme ultraviolet (EUV) radiation, an electron beam (e-beam), or other suitable radiation. Referring to FIG. 8D, block 714 further includes etching the hard mask layer 806 with the patterned resist layer acting as an etch mask and subsequently removing the patterned resist layer, resulting in a patterned hard mask layer 806A over the BARC layer 804.

Figure 8E:
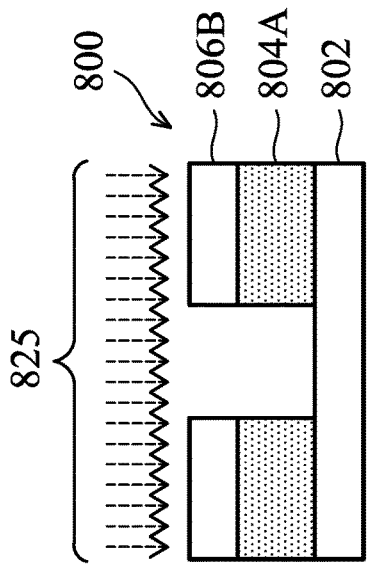

The method 700 proceeds to block 716 where the BARC layer 804 is etched using the patterned hard mask layer 806A as an etch mask. Referring to FIG. 8E, in an embodiment of block 716, the BARC layer 804 may be etched using a wet etching process, a dry etching process, or other suitable etching processes. In some embodiments, an anisotropic dry etching process may be used to etch the BARC layer 804 and thereby form a patterned BARC layer 804A.

Figure 8F:
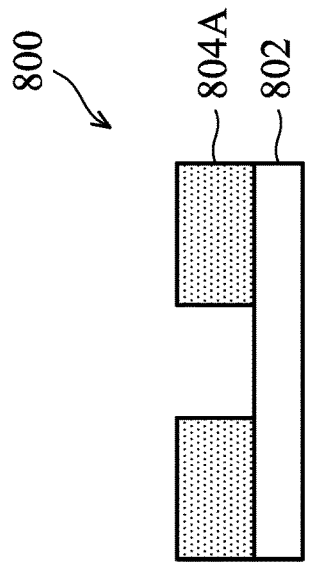

The method 700 proceeds to block 718 where the device 800 and thus the patterned hard mask layer 806A (e.g., the alternative ML composition) is exposed to radiation 825, as shown in FIG. 8F. As described above, and upon exposure to the radiation 825, the patterned hard mask layer 806A (e.g., the alternative ML composition) may become de-cross-linked. As a result of the de-cross-linking, the patterned hard mask layer 806A (e.g., the alternative ML composition) may become a solvent soluble hard mask layer 806B.

Figure 8G:
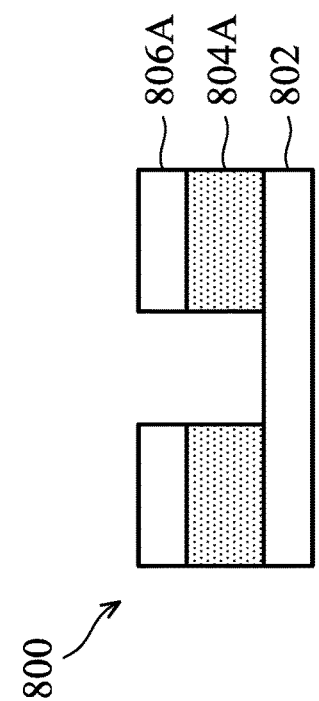
Figure 8H:
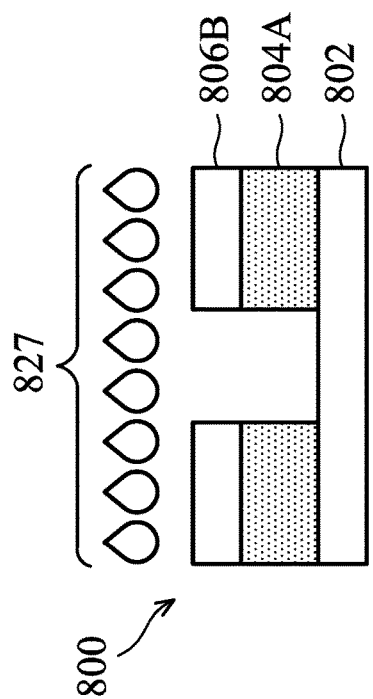

The method 700 proceeds to block 720 where the solvent soluble hard mask layer 806B is removed with an appropriate solution. In the embodiment of block 720 and as shown in FIG. 8G, a solution 827 is applied to the device 800 (e.g., as a wet etching process). In some embodiments, the solution 827 includes an organic solution. In some cases, the solution 827 includes acetone, acetate, ethyl, methyl, water, a combination thereof, or other suitable organic solvent. As a result of the de-cross-linking and solubility of the solvent soluble hard mask layer 806B, the solution 827 is effective in removing the patterned and solvent soluble hard mask layer 806B from the substrate 802 (FIG. 8H), without damaging (e.g., etching) the substrate 802.

As discussed above, additional steps may also be provided before, during, and after the method 700, and some steps described can be replaced, eliminated, or moved before or after other steps for additional embodiments of the method. For example, in an embodiment, the substrate 802 is a semiconductor substrate and the method 700 proceeds to forming fin field effect transistor (FinFET) devices. In such an example, the method 700 may further include forming a plurality of active fins in the semiconductor substrate 802. Additionally, and in furtherance of this example, the method 700 may further include etching the substrate 802 through the openings of the patterned BARC layer 804A to form trenches in the substrate 802; filling the trenches with a dielectric material; performing a chemical mechanical polishing (CMP) process to form shallow trench isolation (STI) features; epitaxial growth and/or recessing of the STI features to form fin-like active regions. In some embodiments, the method 700 includes other steps to form a plurality of gate electrodes, gate spacers, doped source/drain regions, contacts for gate/source/drain features, etc. In some embodiments, subsequent processing may form various contacts/vias/lines and multilayers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Those of ordinary skill in the art will recognize other embodiments and applications of the cleaning solution, without departing from the scope of the present disclosure.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods to improve the patterning and removal of at least portions of a multi-layer resist structure without damage (e.g., etching) to an underlying layer. For example, various embodiments provide an alternative ML material composition and related method in which a previously cross-linked ML may be de-cross-linked by exposure to a radiation source. After such de-cross-linking, the previously insoluble ML material composition becomes soluble. As a result, the de-cross-linked ML may be readily removed (e.g., by a solvent) without damaging an underlying substrate layer. Thus, embodiments of the present disclosure serve to overcome various shortcomings of at least some current resist compositions and methods.

Thus, one of the embodiments of the present disclosure described a method that includes forming a silicon-based resin over a substrate. In various embodiments, the silicon-based resin includes a nitrobenzyl functional group. In some embodiments, a baking process is performed to cross-link the silicon-based resin. Thereafter, the cross-linked silicon-based resin is patterned and an underlying layer is etched using the patterned cross-linked silicon-based resin as an etch mask. In various examples, the cross-linked silicon-based resin is exposed to a radiation source, thereby de-cross-linking the silicon-based resin. In some embodiments, the de-cross-linked silicon-based resin is removed using an organic solution.

In another of the embodiments, discussed is a method where a patterned, non-soluble material layer is formed over a substrate. In some examples, an underlying layer is etched using the patterned, non-soluble material layer as an etch mask. In various embodiments, the patterned, non-soluble material layer is irradiated using a radiation source, thereby converting the patterned, non-soluble material layer to a patterned, soluble material layer. Thereafter, in some embodiments, the patterned, soluble material layer is removed.

In yet another of the embodiments, discussed is a method where a hard mask layer is formed over a BARC layer. In some embodiments, the hard mask layer is patterned and a portion of the BARC layer is removed through the patterned hard mask layer. In some cases, after removing the portion of the BARC layer, the patterned hard mask layer is exposed to a radiation source. In some embodiments, the patterned hard mask layer is then removed using an organic solvent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   forming a silicon-based resin over a substrate, wherein the silicon-based resin includes a nitrobenzyl functional group;
   performing a baking process to cross-link the silicon-based resin;
   patterning the cross-linked silicon-based resin and etching an underlying layer using the patterned cross-linked silicon-based resin as an etch mask;
   exposing the cross-linked silicon-based resin to a radiation source, thereby de-cross-linking the silicon-based resin; and
   removing the de-cross-linked silicon-based resin using an organic solution.

2. The method of claim 1, wherein the removing the de-cross-linked silicon-based resin does not etch the substrate.

3. The method of claim 1, further comprising:
prior to patterning the cross-linked silicon-based resin, forming a patterned resist layer over the cross-linked silicon-based resin;
patterning the cross-linked silicon-based resin while using the patterned resist layer as an etch mask; and
after patterning the cross-linked silicon-based resin, removing the patterned resist layer.

4. The method of claim 1, wherein the silicon-based resin is solvent soluble prior to the baking process, solvent non-soluble after the baking process, and solvent soluble after exposure by the radiation source.

5. The method of claim 1, wherein the silicon-based resin includes a siloxane backbone.

6. The method of claim 1, wherein the nitrobenzyl functional group includes at least one of an alkyl chain, an aromatic ring with C4-C20, hydrogen, a hydroxyl group, an alkoxyl group, an amine, a nitro group, a cyano group, a nitrosyl group, an isocyano group, and a thiol group.

7. The method of claim 1, wherein the silicon-based resin has a molecular weight (MW) equal to about 1,000 to about 20,000.

8. The method of claim 1, wherein the silicon-based resin includes a chromophore.

9. The method of claim 1, wherein the radiation source exposes the cross-linked silicon-based resin to radiation having a wavelength of about 150 nm-300 nm.

10. The method of claim 1, wherein the organic solution includes at least one of acetone, acetate, ethyl, methyl, water, or a combination thereof.

11. A method of semiconductor device fabrication, comprising:
forming a patterned, non-soluble material layer over a substrate;
etching an underlying layer using the patterned, non-soluble material layer as an etch mask;
irradiating the patterned, non-soluble material layer using a radiation source, thereby converting the patterned, non-soluble material layer to a patterned, soluble material layer; and
removing the patterned, soluble material layer.

12. The method of claim 11, wherein the patterned, non-soluble material includes a nitrobenzyl functional group.

13. The method of claim 11, further comprising:
prior to forming the patterned, non-soluble material layer over the substrate, forming a material layer over the substrate, wherein the material layer includes a nitrobenzyl functional group;
performing a baking process to convert the material layer into a non-soluble material layer; and
patterning the non-soluble material layer to form the patterned, non-soluble material layer.

14. The method of claim 12, wherein the nitrobenzyl functional group includes at least one of an alkyl chain, an aromatic ring with C4-C20, hydrogen, a hydroxyl group, an alkoxyl group, an amine, a nitro group, a cyano group, a nitrosyl group, an isocyano group, and a thiol group.

15. The method of claim 11, wherein the patterned, soluble material layer is removed using an organic solvent.

16. A method of semiconductor device fabrication, comprising:
forming a hard mask layer over a BARC layer;
patterning the hard mask layer and removing a portion of the BARC layer through the patterned hard mask layer;
after removing the portion of the BARC layer, exposing the patterned hard mask layer to a radiation source; and
removing the patterned hard mask layer using an organic solvent.

17. The method of claim 16, further comprising:
prior to forming the hard mask layer over the BARC layer, spin-coating the BARC layer over a substrate;
forming a middle layer over the BARC layer; and
as a result of baking the middle layer, forming the hard mask layer over the BARC layer.

18. The method of claim 17, wherein the removing the patterned hard mask layer is performed without etching the substrate.

19. The method of claim 17, wherein the substrate includes a low-K film.

20. The method of claim 16, wherein hard mask layer includes a nitrobenzyl functional group, wherein the hard mask layer includes a siloxane backbone, and wherein the hard mask layer has a molecular weight (MW) equal to about 1,000 to about 20,000.

* * * * *